US009620956B2

(12) United States Patent
Jankowski (10) Patent No.: US 9,620,956 B2
(45) Date of Patent: Apr. 11, 2017

(54) SOCKET FOR A SOLAR PANEL WITH A PROTECTIVE CIRCUIT

(75) Inventor: Martin Jankowski, Seelze (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 228 days.

(21) Appl. No.: 14/239,285

(22) PCT Filed: Aug. 14, 2012

(86) PCT No.: PCT/EP2012/003459
§ 371 (c)(1),
(2), (4) Date: Apr. 11, 2014

(87) PCT Pub. No.: WO2013/026539
PCT Pub. Date: Feb. 28, 2013

(65) Prior Publication Data
US 2014/0301003 A1    Oct. 9, 2014

(30) Foreign Application Priority Data

Aug. 19, 2011    (DE) .................. 10 2011 110 682

(51) Int. Cl.
*H02H 9/02*    (2006.01)
*H01L 31/02*    (2006.01)
*H02S 40/34*    (2014.01)

(52) U.S. Cl.
CPC ......... *H02H 9/02* (2013.01); *H01L 31/02021* (2013.01); *H02S 40/34* (2014.12); *Y02E 10/50* (2013.01)

(58) Field of Classification Search
CPC .......................... H01L 31/02021; H02H 3/023
See application file for complete search history.

(56) References Cited

U.S. PATENT DOCUMENTS

| 6,650,031 | B1 | 11/2003 | Goldack |
| 7,772,716 | B2 | 8/2010 | Shaver, II et al. |
| 8,809,699 | B2 | 8/2014 | Funk |
| 8,859,884 | B2 | 10/2014 | Dunton et al. |

(Continued)

FOREIGN PATENT DOCUMENTS

| AU | 2012225199 | 10/2013 |
| CN | 101951190 | 1/2011 |

(Continued)

OTHER PUBLICATIONS

German Office Action, Serial No. 10 2013 101 314.7, Applicant: Phoenix Contact GmbH & Co. KG, Mail Date: Dec. 20, 2013.

(Continued)

*Primary Examiner* — Thienvu Tran
*Assistant Examiner* — Tien Mai
(74) *Attorney, Agent, or Firm* — Reising Ethington P.C.

(57) ABSTRACT

The present disclosure relates to a junction box for a solar panel, having a protective circuit that defines an operating state and a protected state. The protective circuit includes a short-circuiting switch between the output-side connecting elements of the first and second external connecting lines and an isolating switch between the short-circuiting switch and one of the poles of the solar panel, in which in the protected state, the short-circuiting switch short-circuits the output-side connecting elements of the first and second connecting lines to each other and the isolating switch disconnects the short-circuiting switch from the solar panel on at least one side.

17 Claims, 6 Drawing Sheets

(56) References Cited

U.S. PATENT DOCUMENTS

| | | | |
|---|---|---|---|
| 8,963,375 | B2 | 2/2015 | DeGraaff |
| 2009/0014057 | A1 | 1/2009 | Croft et al. |
| 2009/0207543 | A1 | 8/2009 | Boniface et al. |
| 2010/0043870 | A1 | 2/2010 | Bennett et al. |
| 2010/0139734 | A1 | 6/2010 | Hadar et al. |
| 2010/0241375 | A1 | 9/2010 | Kumar et al. |
| 2010/0300508 | A1 | 12/2010 | Maier et al. |
| 2010/0321148 | A1 | 12/2010 | Gevorkian |
| 2011/0172842 | A1 | 7/2011 | Makhota et al. |
| 2012/0194003 | A1 | 8/2012 | Schmidt et al. |
| 2014/0137920 | A1 | 5/2014 | Berg |
| 2014/0311546 | A1 | 10/2014 | Kruse et al. |
| 2016/0006392 | A1 | 1/2016 | Hoft |

FOREIGN PATENT DOCUMENTS

| | | | |
|---|---|---|---|
| CN | 201918923 | U | 8/2011 |
| CN | 201927619 | U | 8/2011 |
| CN | 102598287 | A | 7/2012 |
| DE | 19844977 | | 4/2000 |
| DE | 102007037130 | B3 | 4/2009 |
| DE | 102009051186 | | 5/2010 |
| DE | 102009022569 | | 12/2010 |
| DE | 102010023549 | A1 | 12/2011 |
| DE | 102010054354 | | 6/2012 |
| DE | 102011079074 | | 1/2013 |
| DE | 102011079074 | A1 | 1/2013 |
| DE | 102011107365 | | 1/2013 |
| DE | 102013101314 | A1 | 8/2014 |
| EP | 2256819 | A1 | 12/2010 |
| JP | 2006278755 | | 10/2006 |
| WO | 2009073868 | | 6/2009 |
| WO | 2010078303 | | 7/2010 |
| WO | WO2011/023732 | A2 | 3/2011 |
| WO | 2012079742 | A1 | 6/2012 |
| WO | 2013000762 | A2 | 1/2013 |
| WO | 2013007638 | A2 | 1/2013 |
| WO | 2013010083 | A2 | 1/2013 |

OTHER PUBLICATIONS

PCT International Search Report, Int. Serial No. PCT/EP2014/052663, Int. Filing Date: Feb. 11, 2014, Applicant: Phoenix Contact GmbH & Co. KG, Mail Date: May 26, 2014.

Eng. Translation of Int Preliminary Report on Patentability, Int Serial No. PCT/EP2012/003459, Int. Filing Date: Aug. 14, 2012, Applicant: Phoenix Contact GmbH & Co. KG et al., Mail Date: Feb. 25, 2014.

Int Search Report and Written Opinion, Int App No: PCT/EP2012/003459, Int Filing Date: Aug. 14, 2012, Applicant: Phoenix Contact GmbH & Co. KG, Mailed: Dec. 21, 2012.

German Office Action, Date: Apr. 22, 2014, Applicant: Phoenix Contact GmbH & Co. KG, Serial No. 102011110682.4.

Chinese Office Action, Application No. 201480019926.3, Applicant: Phoenix Contact GmbH & Co. KG, Title: Safe Photovoltaic System, Mail Date: Jun. 3, 2016.

PCT International Search Report and Written Opinion, Int. Serial No. PCT/EP2014/052666, Int. Filing Date: Feb. 11, 2014, Applicant: Phoenix Contact GmbH & Co. KG, Mail Date: May 15, 2014.

China Office Action, Application No. 201280040488.X, Applicant: Phoenix Contact GmbH Co. KG, Title: Socket for a Solar Panel with a Protective Circuit, Mail Date: Aug. 5, 2015.

Search result from the German Patent and Trademark Office, Mail Date: Nov. 18, 2014.

German Office Action, Applicant: Phoenix Contact GmbH & Co. KG, Serial No. 10 2015 114 755.6, Mail Date: May 20, 2016.

SOCKET FOR A SOLAR PANEL WITH A PROTECTIVE CIRCUIT

TECHNICAL FIELD

The present disclosure relates to solar panels and, more particularly, to protective circuits for solar panels.

BACKGROUND

Solar panels typically have a junction box, which is sometimes also referred to as a PV (photovoltaic) junction box, a (PV) junction and connecting box, or a (PV) connecting box. This junction box has a typically flat dielectric housing and is mounted, e.g. glued, to the back side of the solar panel oriented away from the sun. The solar panels have voltage-carrying conductors, typically in the form of thin conductor bands referred to as so-called ribbons, which extend out from the back of the solar panels and constitute the electrical poles of the solar panel, i.e. between which the voltage generated by the solar panel is present. A solar panel typically has a plurality of solar cells connected in series and/or in parallel in the solar panel. Optionally, one or more intermediate takeoffs between the solar cells or groups of solar cells of the solar panel are routed out from the solar panel and are contacted in the junction box. The interior of the junction box for the solar panel usually includes input-side connecting elements or terminals—e.g., spring-loaded terminals that are used to connect and contact the conductor ribbons of the positive pole and negative pole of the solar panel, which protrude through the bottom of the junction box into the interior of the junction box housing—and a bypass diode for the solar panel and optionally, further connecting elements and further bypass diodes in solar panels with one or more intermediate takeoffs.

The junction box also has output-side connecting elements or terminals, e.g. in the form of spring-loaded terminals or plug connectors, for connecting external connecting lines so that by means of the output-side connecting elements and the input-side connecting elements that are connected to them inside the junction box, the first and second external connecting lines can be electrically connected to the positive pole and negative pole of the solar panel in order to wire the solar panels.

Examples of such junction boxes for solar panels are described in DE 10 2007 037 130 and DE 10 2007 042 547.

A solar generator is typically composed of a plurality of solar panels, which are in turn connected in series to form so-called strings in order to achieve a DC solar generator voltage that can be as high as 1,000 V in modern systems. Furthermore, depending on the number of interconnected solar panels and their individual voltages, a plurality of strings may in turn be connected in parallel. Because of the high voltage in the DC voltage part of the solar plant and the currents that are produced, which can be in the ampere range, when hazardous incidents such as a fire occur, there is an acute risk of rescue personnel being exposed to potentially lethal voltages. In particular, firefighters attempting to extinguish a fire burning on a roof structure equipped with a solar plant would risk exposure to potentially lethal voltages conducted by the fire-fighting water. This hazard is particularly present during the daytime, but even at night, the residual light can still result in dangerous voltages in large systems. Hazards of this kind, however, are present not only in the event of a fire, but can also be present with the occurrence of other unusual hazardous incidents or accidents, storm damage or motor vehicle collisions with free-field systems, to name but a few examples while making no claim as to the completeness of this list.

A solar plant does typically have a main circuit breaker or main disconnect switch in the so-called (string) combiner box, but in the event of damage to the solar panels or the connecting lines due to fire, water, hail, etc., this cannot be used to disconnect the region upstream of the (string) combiner box. Moreover, it is also not possible to selectively disconnect individual solar panels.

Furthermore, solar panels produce voltage any time they are exposed to light, which can be the case even during the installation of solar junction boxes to the solar panel, storage, transport, and in particular, installation of solar panels at the destination point. For this reason, even during the installation of solar panels and the connection of connecting lines, when there is corresponding exposure to light, high voltages can be produced that require safe handling and special touch-proofing. Even a single solar panel, due to a series connection of a plurality of solar cells in the solar panel, can produce a voltage that requires safety precautions. For this reason, touch-proof plug connectors are typically used, e.g., from the SUNCLIX® system produced by the applicant, which ensure a high degree of safety. However, it can nevertheless be desirable—in order to further increase safety—to switch the solar generator so that it is as voltage-free as possible, in fact connecting it upstream of the main circuit breaker, in particular directly at the solar panels.

DE 10 2009 024 516 A1 has disclosed a safety device for a junction box, which is for producing an electrical connection to a solar panel and produces an electrically conductive cross connection between the connecting elements so that in the active state, the output voltage is reduced to zero.

When the cross connection is produced, however, a power loss occurs in the safety device, which can possibly lead to undesirable heating. Remaining in this state for a long time can, under certain circumstances, result in damage to the safety device or to the solar panels.

In addition, the safety device is primarily conceived to produce a short circuit in the event of a fire, e.g., a hazardous incident that occurs during ongoing operation. Bringing the safety device into the state in which the output voltage is reduced to zero requires an active control intervention for this purpose. In the event of a hazardous incident such as a fire, under certain circumstances, the safety device may itself already be damaged or destroyed by the time the arriving firefighters, for example, wish to activate it, so that at this point, it may no longer be possible to activate the safety device and the desired safety functionality may no longer be effective.

Consequently, although various safety measures for photovoltaic generators do already exist, they are nevertheless in need of improvement.

SUMMARY OF THE PRESENT DISCLOSURE

An object of the present disclosure, therefore, is to provide a junction box for a solar panel, which is equipped with a protective circuit, or to provide a protective circuit, which ensures a high degree of safety in the event of hazardous incidents.

Another object of the present disclosure is to provide a junction box for a solar panel, which is equipped with a protective circuit, or to provide a protective circuit, which can remain in the protected state over a long period of time and ensures a high degree of safety, even during storage, transport, and installation and also ensures a convenient installation.

Another object of the present disclosure is to provide a junction box for a solar panel, which is equipped with a protective circuit, or to provide a protective circuit, which automatically switches into the protected state in the event of a hazardous incident, even when partially destroyed, and in which the junction box is able to perform certain functions even in the protected state.

The object of the present disclosure is achieved by the subjects of the independent claims. Advantageous modifications of the present disclosure are defined in the dependent claims.

According to the present disclosure, a junction box for a solar panel is provided for electrically connecting external connecting lines to a solar panel. The junction box has a junction box housing that can be mounted onto the solar panel and in particular, has an underside, which can be placed onto the solar panel and has openings to permit voltage-carrying conductors extending out from the solar panel to be inserted into the junction box. These voltage-carrying conductors of the positive pole and negative pole of the solar panel are usually embodied in the form of thin conductor bands, i.e., so-called ribbons. On the underside, the hat-shaped junction box housing is provided, for example, with a circumferential gluing frame with which the junction box housing is glued to the back surface of the solar panel oriented away from the sun. In the junction box housing, the conductor ribbons extending out from the solar panel and into the junction box are electrically connected by means of input-side connecting elements, e.g., spring-loaded terminals. Consequently, the junction box has at least one input-side electrical connecting element for the positive pole conductor band and one input-side electrical connecting element for the negative pole conductor band.

The junction box also includes at least one first and second output-side connecting element or terminal for connecting a first and second external connecting line, e.g., the two string cables with which the solar panel is connected in series to other solar panels, for example, to the respectively adjacent solar panels. The connecting elements for the external connecting cables can be embodied, for example, in the form of contact clamps that contact the conductor end of the respective string cable, which is inserted into the junction box, or else the junction box itself is already provided with plug connectors for connecting the respective string cable.

In addition, an electrical or electronic protective circuit, which defines an operating state and a protected state, is built into the junction box housing. In the operating state, the respective solar panel is connected to the current-drawing devices, i.e., in a grid-coupled solar plant, is connected to the power grid and feeds its electrical power into the power grid. Consequently, in the operating state, the first external connecting line is electrically connected to the voltage-carrying or live conductor of the positive pole of the solar panel, and the second external connecting line is electrically connected to the voltage-carrying conductor of the negative pole of the solar panel so that the electrical power produced by the solar panel can be fed into the power grid via the first and second external connecting line.

The protective circuit includes a short-circuiting switch between the output-side connecting elements of the first and second external connecting lines and an isolating switch between the short-circuiting switch and one of the two poles of the solar panel. The short-circuiting switch is open in the operating state so that the electrical power of the solar panel can be fed into the grid and in the protected state; the output-side connecting elements of the first and second external connecting lines are short-circuited inside the junction box. This results in the fact that the solar panel is no longer able to output current via the string line. The isolating or disconnecting switch is then connected in series between the conductor of the positive pole of the solar panel or the conductor of the negative pole of the solar panel and the short-circuiting switch. In the operating state, therefore, the short-circuiting switch is open and the isolating switch is closed in order to conduct and feed the electrical current of the solar panel to the output-side connecting elements. In the protected state, however, the isolating switch is open in order to disconnect at least one side of the closed short-circuiting switch from the poles of the solar panel. Consequently, in the protected state, the external connecting lines are disconnected from the power of the solar panel such that on the one hand, the panel is bypassed in the string line by means of the short-circuiting switch and on the other hand, it is disconnected at least on one side from the string lines so that the solar panel is not itself short-circuited despite the closed short-circuiting switch.

This has several advantages. On the one hand, the short-circuiting switch is not encumbered by the power loss of the associated solar panel, but instead merely functions as a low-resistance or low-impedance bypass of this solar panel in the string line. As a result, the protective circuit can remain in the protected state for practically any amount of time without generating any appreciable heat, even when the solar panel is exposed to light. On the other hand, the associated solar panel is not itself short-circuited despite the existence this short-circuit bypass so that the electrical power of the solar panel is not in fact fed into the string line, but continues to remain available inside the junction box. Consequently, electrical or electronic devices in the junction box can nevertheless continue to be supplied with electrical energy from the associated solar panel even though the protective circuit is in the protected state and the output side of the junction box is short-circuited.

The short-circuiting switch is situated in the junction box, in particular directly upstream—from the perspective of the poles of the solar panel—of the output-side connecting elements of the first and second external connecting lines, e.g., the connecting terminals for the stripped ends of the string line inside the junction box housing or the integrated plug connector for the string line. In the junction box, the isolating switch is series-connected directly between the input-side connecting element of the voltage-carrying conductor of the positive pole of the solar panel or the input-side connecting element of the voltage-carrying conductor of the negative pole of the solar panel and one of the connections of the short-circuiting switch.

The junction box preferably has a conventional bypass circuit for shadowing effect compensation, e.g. a bypass diode. In this case, the isolating switch is connected in series with the bypass circuit for shadowing effect compensation and the short-circuiting switch is connected in parallel with the bypass circuit for shadowing effect compensation. The bypass circuit for shadowing effect compensation is connected upstream—from the perspective of the poles of the solar panel—of the isolating switch and short-circuiting switch so that the bypass circuit for shadowing effect compensation remains connected to the solar panel and operative even in the protected state. This can be particularly advantageous in solar panels with intermediate takeoffs and a plurality of bypass circuits in each solar panel or junction box.

Solar panels typically have a multitude of solar cells that are connected in series and/or in parallel inside the solar panel. Frequently, the solar panels then have intermediate takeoffs at which the electrical power of the solar cells is taken, which are connected together in series and/or in parallel to form groups inside the solar panel. These groups can then be contacted separately by means of the junction box. For this purpose, the junction box in the junction box housing has additional input-side connecting elements for connecting the conductor ribbons extending out from the solar panel, the intermediate takeoffs, and a plurality of bypass circuits for shadowing effect compensation respectively between the input-side connecting elements for the conductor ribbons of the positive pole, the intermediate takeoffs, and the negative pole of the solar panel. The bypass circuits are consequently each connected in parallel with the subsections of the respective solar panel that are separately contacted with the junction box when the junction box is mounted onto the solar panel. In this case, the short-circuiting switch is connected in parallel with all bypass circuits for shadowing effect compensation and in parallel with all groups of solar cells or separately contacted subsections of the solar panel and the isolating switch is connected in series between the short-circuiting switch and all bypass circuits for shadowing effect compensation and all separately contacted subsections of the solar panel. Consequently, in the protected state, the short-circuiting switch is disconnected from all separately contacted subsections of the solar panel and from all bypass circuits for shadowing effect compensation.

In particular, the protective circuit or more precisely, the short-circuiting switch and isolating switch is/are built into the junction box housing upstream—from the perspective of the poles of the solar panel—of any detachable connectors situated outside the junction box housing. It is therefore possible to ensure that any detachable cable connection outside of the junction box housing can be switched to the powerless state, thus achieving a high standard of safety.

According to one embodiment of the present disclosure, the junction box includes a control unit that controls the switching of the protective circuit—or more precisely, the short-circuiting switch and isolating switch—from the protected state into the operating state. The control unit is situated upstream—from the perspective of the poles of the solar panel—of the isolating switch and thus in the protected state, can be supplied with electrical energy from the associated solar panel since in the protected state, the control unit is disconnected on at least one side from the short-circuiting switch by means of the isolating switch, but remains connected to the solar cells. Consequently, the control unit can be supplied with electrical energy in order to control the switches of the protective circuit, not only in the operating state but also in the protected state. Furthermore, the protective circuit is in particular embodied to be reversible so that it can be switched from the operating state into the protected state and back again any number of times. Consequently, the protective circuit disclosed here can be switched into the protected state not just once, e.g. in the event of a fire, but reversibly and without manual intervention in the junction box, for example also during setup and installation and during maintenance work. It is also advantageous that the solar panels can be switched into the protected state individually, i.e. can be individually disconnected from the string.

In a simple embodiment, the protective circuit is composed of only the control unit, a short-circuiting switch, and an isolating switch. The short-circuiting switch and/or the isolating switch are suitably embodied as mechanical switches, electromechanical switches or semiconductor switches.

In a preferred embodiment, the short-circuiting switch is embodied as a break contact, which is closed in the inactive state (normally-closed switch). The isolating switch is embodied as a make contact and is open in the inactive state (normally-open switch). This advantageously has the result that the short-circuiting switch and isolating switch automatically switch into the inactive state when they are no longer supplied with electrical energy by the solar panel. Therefore the protective circuit can still switch from the operating state into the protected state even in absolute darkness when the electrical connection to the associated solar panel is interrupted, for example in the event of a faulty contact with the conductor ribbons or in later stages of a fire when the solar module has already been destroyed. In addition, the protective circuit automatically switches into the protected state if the control unit is defective. The control is preferably embodied so that the protective circuit, once it is in the protected state, remains in the protected state until it is activated by the control unit, i.e. is actively switched from the inactive protected state into the operating state, even if the associated solar panel is still delivering electrical power. For example, it is suitable to use a relay embodied as a break contact or normally-closed contact for the short-circuiting switch and a relay embodied as a make contact or normally-open contact for the isolating switch for this purpose. However, a protective circuit in which the protected state is embodied as the inactive state can also be implemented using a normally-on MOSFET (depletion type) and a normally-off MOSFET (enrichment type) as the short-circuiting switch and isolating switch, respectively.

The activation from the protected state into the operating state preferably occurs by remote control from outside the junction box, e.g., by means of a radio connection or via the string lines, e.g., by means of so-called power line communication.

Preferably, the control unit includes a safety device that requires an authorization, e.g., a code entry, for the activation of the protective circuit from the protected state into the operating state. This not only makes it possible to protect against a switching into the operating state by unauthorized personnel, but also offers an inherent theft protection since without the authorization code, a thief cannot activate the solar panel into the operating state without removing the junction box.

A conventional antitheft device can nevertheless also be built into the junction box housing. Furthermore, a maximum power point tracking control unit, a voltage monitoring unit, a current monitoring unit and/or a temperature monitoring unit are built into the junction box housing, which are connected—from the perspective of the poles of the solar panel—upstream of the isolating switch and short-circuiting switch. Consequently, the antitheft device, the maximum power point tracking control unit, the voltage monitoring unit, the current monitoring unit, and/or the temperature monitoring unit can be supplied with electrical power from the solar panel even in the protected state.

Consequently, the present disclosure also relates to an electrical protective circuit for installation into a junction box for a solar panel, by means of which the voltage-carrying conductor ribbons of the positive pole and negative pole of the solar panel on the one hand and the string lines on the other are attached and electrically connected to each other, wherein the protective circuit defines an operating state in which the electrical power of the solar panel is conducted out via the first and second external connecting lines and a protected state in which the associated solar panel is disconnected from the external connecting lines;

a control unit for controlling the protective circuit is included;

the protected state is an inactive state into which the protective circuit automatically falls when without current and in which it remains until the protective circuit is activated once more by an activation intervention by means of the control unit; and when the protective circuit is built into the junction box on a solar panel, the control unit is supplied with electrical power from the associated solar panel in the protected state so that it is able to activate the protective circuit from the protected state into the operating state.

For the delivery and setup of a solar generator, the solar panels are each equipped by the manufacturer with a junction box with an integrated protective circuit and are delivered to the installation site, e.g. the roof of a building, in the protected state. At the installation site, the solar panels are installed and wired to the string lines. Then, the solar generator is subjected to standardized commissioning tests, e.g., according to DIN VDE 0100-600, DIN VDE 0100-600:2008-06, IEC 60364-6:2006 HD 60364-6:2007 and/or DIN EN 62446 VDE 0126-23:2010-07. The protective circuits of the solar panels are switched from the protected state into the operating state and electrical power is thus fed through the wiring only after the installation and commissioning tests of the solar generator have been completed. This ensures a particularly high degree of safety during transport, storage, and installation of the solar panels or solar generator.

If the activation of the protective circuit from the protected state into the operating state by the control unit requires an authorization, e.g., a code entry, assurance can also be provided that the individually possible activation or enabling of solar panels can only be performed by special, inspection-authorized personnel. If no authorized enabling has been carried out, then the solar generator remains without power downstream (as seen from the solar panels) of the junction box.

The switching from the operating state into the protected state, i.e. the disconnection of the solar panel from the string lines, can be performed, e.g., for maintenance and in the event of a hazardous incident during exposure to light. For maintenance work, it is particularly advantageous that the solar panels can be disconnected individually. When disconnecting, it is preferable to first switch the short-circuiting switch in the respective protective circuit in order to short-circuit the output-side connecting elements of the first and second external connecting lines to each other and thus to produce a bypass in the string line for the respective solar panel and only in a subsequent, second step to open the isolating switch and thus disconnect the already closed short-circuiting switch from at least one pole of the solar panel.

The present disclosure will be explained in greater detail below based on exemplary embodiments and in conjunction with the drawings; some elements that are the same or similar have been provided with the same reference numerals; and the features of the different exemplary embodiments can be combined with one another.

DETAILED DESCRIPTION

Figure 1:
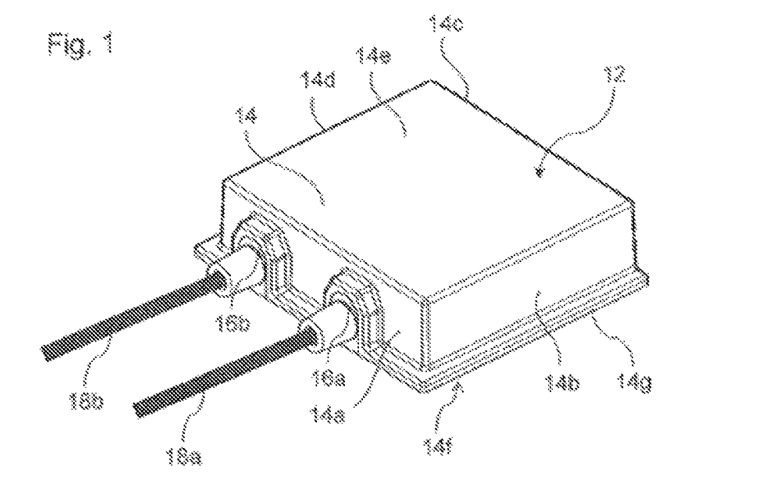
FIG. 1 is a perspective depiction of a junction box for a solar panel.

In general, the present disclosure relates to a junction box for a solar panel with a protective circuit, in particular for selectively disconnecting one or more solar panels of a solar generator from the external connecting lines. More specifically, with reference to the drawing figures, FIG. 1 shows a junction box 12 with a junction box housing 14 for installation on the back side of a solar panel. The dielectric junction box housing 14 is embodied as hat-shaped and has encompassing side walls 14*a* through 14*d* as well as a cover 14*e*.

On the underside of the junction box housing 14 that is not visible in FIG. 1, there are openings through which the conductor ribbons extending out from the solar module extend into the junction box 12 in order to be connected and contacted there.

On one of the side walls 14*a*, the junction box housing 14 has a first and second cable feedthrough 16*a*, 16*b* through which the string lines 18*a* and 18*b* are routed into the junction box 12 and on the inside of the junction box housing 14, are connected—e.g., by means of contact terminals that are not shown in order to conduct away the electrical power produced by the solar panel. With regard to the basic mechanical design of a junction box for a solar panel, it is referred, for example, to DE 10 2007 037 130 and DE 10 2007 042 547.

Figure 2:
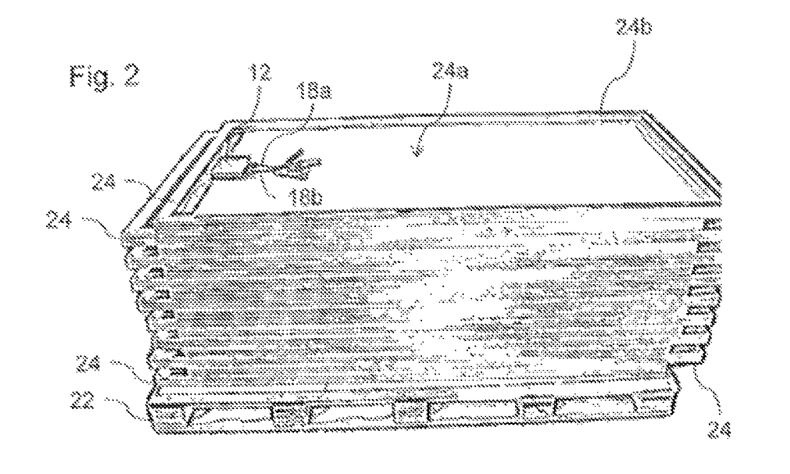
FIG. 2 is a perspective depiction of a stack of solar panels with junction boxes mounted onto them.

FIG. 2 shows 16 solar panels 24 stacked on a pallet 22. The uppermost solar panel 24 shown here is resting with its back side 24*a* toward the top and the junction box 12 with prefabricated string lines 18*a* and 18*b* is glued to the back side 24*a*. For this purpose, the junction box housing 14 is provided with a circumferential gluing frame 14*g* on its underside 14*f*.

The solar panel 24 has a surrounding aluminum frame 24*b*, which forms a recess on the back side of the solar panel so that the glue-mounted junction box 12 is provided with relatively good mechanical protection. FIG. 2 shows a typical state in which solar panels are delivered.

Figure 3:
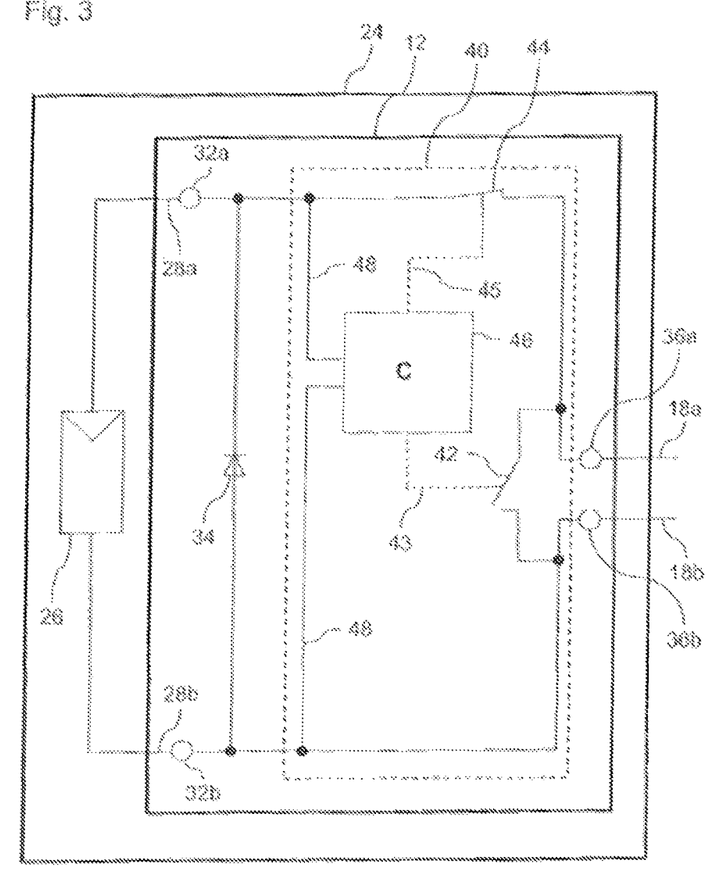
FIG. 3 is a schematic depiction with a wiring diagram of a first embodiment of the present disclosure in the operating state.

FIG. 3 is a schematic depiction of the solar panel 24 with a plurality of solar cells. The photovoltaic solar cells in their entirety are represented by the symbol 26. Two conductor ribbons 28*a*, 28*b* extend out from the solar module, constituting the positive pole and negative pole of the solar module. The conductor ribbons 28*a* and 28*b* protrude into the junction box 12 from underneath and are connected to and contacted with input-side connecting elements 32*a* and 32*b*. Examples for connecting elements in the form of contact terminals can be found in DE 10 2007 037 130 and DE 10 2007 042 547. The junction box 12 also contains a bypass diode 34 connected in parallel with the solar cells 26.

The junction box 12 contains a protective circuit 40 with a short-circuiting switch 42, which is connected in parallel to the solar cells 26 and bypass diode 34. The short-circuiting switch 42 is located directly at the output-side connecting elements 36a and 36b and can short-circuit them. The output-side connecting elements 36a, 36b are connected to the string cables 18a and 18b. This can be achieved, for example, by means of contact terminals, but it is also possible for the junction box 12 or junction box housing 14 to be directly equipped with plug connectors.

The protective circuit 40 also includes the isolating switch 44, which is connected in series between the short-circuiting switch 42 and one of the two input-side connecting elements, in this example, the input-side connecting element 32a for the positive pole of the solar cells 26. The short-circuiting switch 42 and the isolating switch 44 are controlled by a controller or control unit 46. The respective control is symbolized with dashed lines 43, 45 that represent control lines, for example. The control unit 46 is supplied with electrical power from the solar cells 26 of the associated solar panel via supply lines 48. The supply lines 48 are connected upstream of the isolating switch 44 from the perspective of the solar panel. FIG. 3 shows the protective circuit 40 in the operating state, i.e. the short-circuiting switch 42 is open and the isolating switch 44 is closed, so that the solar cells 26 of this solar panel 24 are connected to the string lines 18a, 18b and the electrical power of this solar panel can be fed in the grid via the string lines 18a, 18b.

Figure 4:
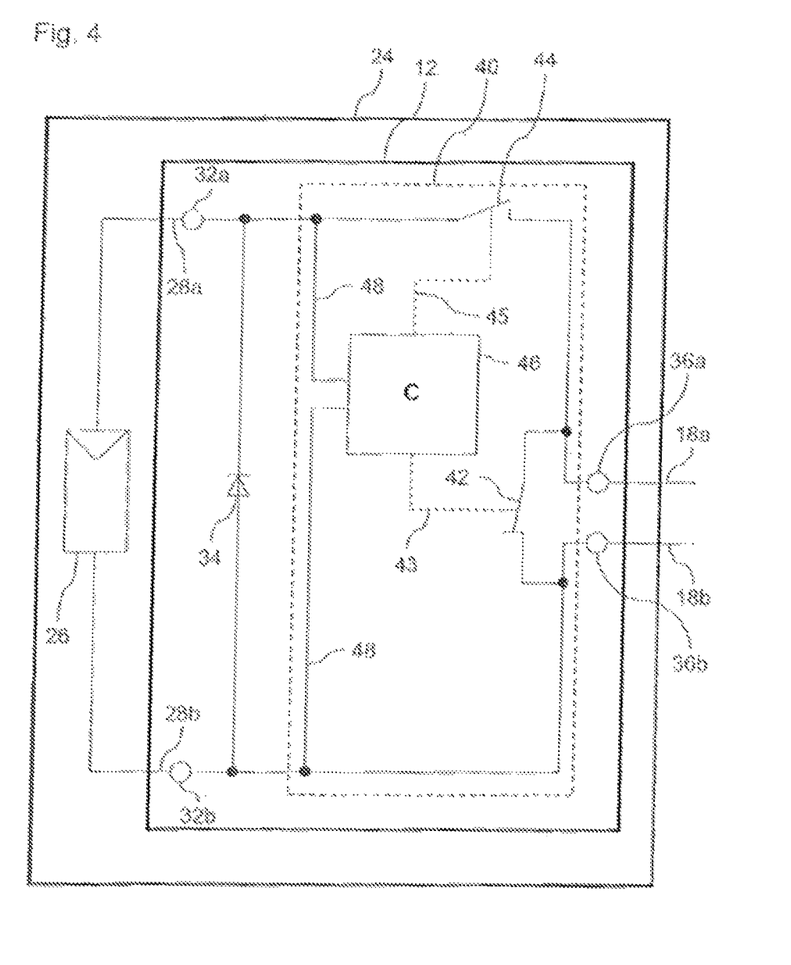
FIG. 4 shows the embodiment from FIG. 3 in the protected state.

FIG. 4 shows the solar panel 24 from FIG. 3, with the protective circuit 40 switched into the protected state. In the protected state, the short-circuiting switch 42 is closed and consequently short-circuits the output-side connecting elements 36a and 36b to each other so that this solar panel 24 is provided with a low-impedance bypass relative to the string lines 18a and 18b. The remaining solar panels can continue to produce electrical power and feed it into the grid since the circuit of the string lines 18a, 18b is closed via the closed short-circuiting switch 42. The string voltage is merely reduced due to the lack of this solar panel 24.

In the protected state shown, the serial isolating switch 44 is open so that the short-circuiting switch 42, although it is closed, does not short-circuit the solar cells 26 of this solar panel 24. Consequently, the solar cells 26 of this solar panel 24 do not cause any power loss in the closed short-circuiting switch 42. Furthermore, the bypass diode 34 remains connected to the solar cells 26. In the protected state shown, the control unit 46 also continues to be supplied with electrical power from the solar cells 26.

Figure 5:
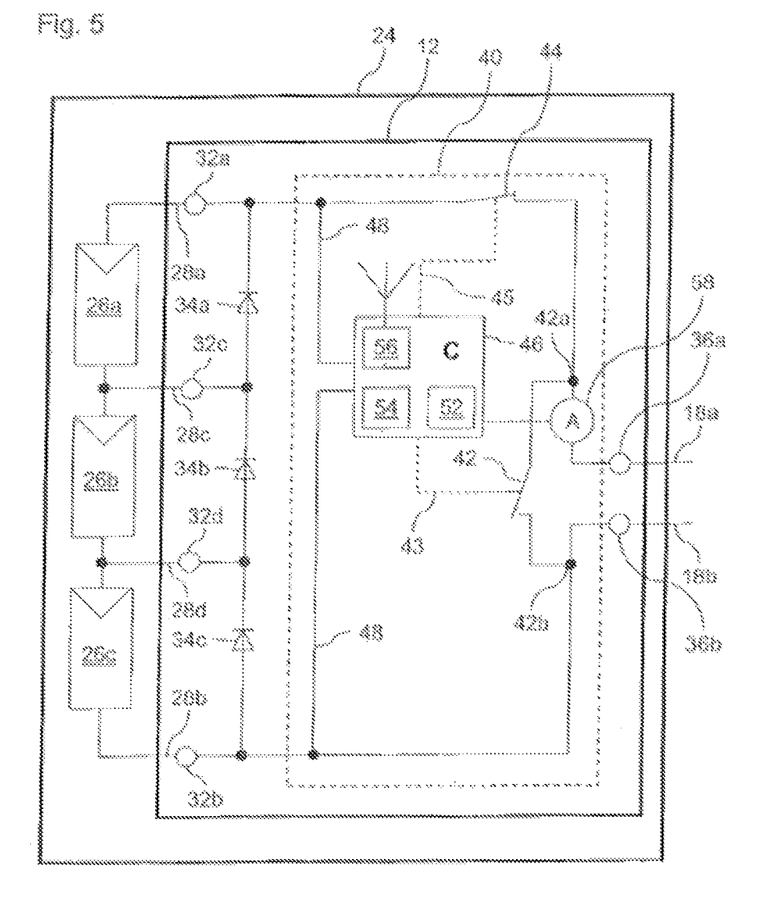
FIG. 5 shows another embodiment of the present disclosure in the operating state.

The embodiment of the solar panel 24 shown in FIG. 5 has a solar module that is divided into three groups of solar cells 26a, 26b, 26c. The groups of solar cells 26a, 26b, 26c in turn are typically composed of a plurality of individual solar cells, which, internal to the module, can be connected in series and/or in parallel within the groups. Intermediate takeoffs in the form of additional conductor ribbons 28c and 28d are provided between the groups 26a, 26b, 26c. These intermediate takeoffs are connected to and contacted with additional input-side connecting elements 32c, 32d inside the junction box housing. The intermediate takeoffs can be used to associate the subgroups of the solar cells 26a, 26b, 26c in a solar module 24 with separate bypass diodes 34a, 34b, 34c such that each of the separately wired and connected groups of solar cells 26a, 26b, 26c is connected in parallel to a respective bypass diode 34a, 34b, 34c.

In addition, the control unit 46 has an electronic function element componentry 52, e.g. a current-, voltage-, and/or temperature monitoring unit or a theft prevention device, an MPPT control unit, or the like. Since the control unit 46 is connected to both poles of the solar panel upstream of the short-circuiting switch 42 and the isolating switch 44, the function element componentry 52 is supplied with electrical power from the solar cells 26a, 26b, 26c in both the operating state and the protected state.

The control unit 46 also has a safety device 54, which requires a code entry in order to open the short-circuiting switch 42 and close the isolating switch 44, i.e. in order to switch the protective circuit 40 from the protected state into the operating state. The control unit 46 also has a radio unit 56 that receives corresponding radio signals from a central control unit, not shown, so that each solar panel 24 can be centrally controlled, in particular switched into the operating state, by authorized personnel.

In this exemplary embodiment, the string current is monitored by a current sensor 58 in the junction box. The current sensor 58 is connected between one of the two output-side connecting elements 36a, 36b and the associated connection 42a or 42b of the short-circuiting switch 42 in order to be able to measure the string current in the junction box 12, both in the operating state and in the protected state. In the operating state, the current flows via the solar cells 26a, 26b, 26c of the associated solar panel 24 while in the protected state, the current flows via the closed short-circuiting switch 42. In other words, the current sensor 58 is connected in series with the short-circuiting switch 42 in relation to the external connecting lines 18a, 18b (string line) connected to the external connecting elements 36a, 36b. By means of this (string) current monitoring in the junction box 12, it is possible to activate and deactivate the protective circuit 40 in response to the level of current measured. For example, if the string line 18a, 18b is without current, e.g. because the DC (main) circuit breaker upstream of the inverter is switched off, the protective circuit 40 automatically switches into the protected state in response to the current interruption measured in the junction box. Later, the protective circuit can be switched from the protected state back into the operating state by an initial current through the string, e.g. from the string combiner box, since the string line is interruption-free, even though some or even all of the protective circuits are in the protected state.

Figure 6:
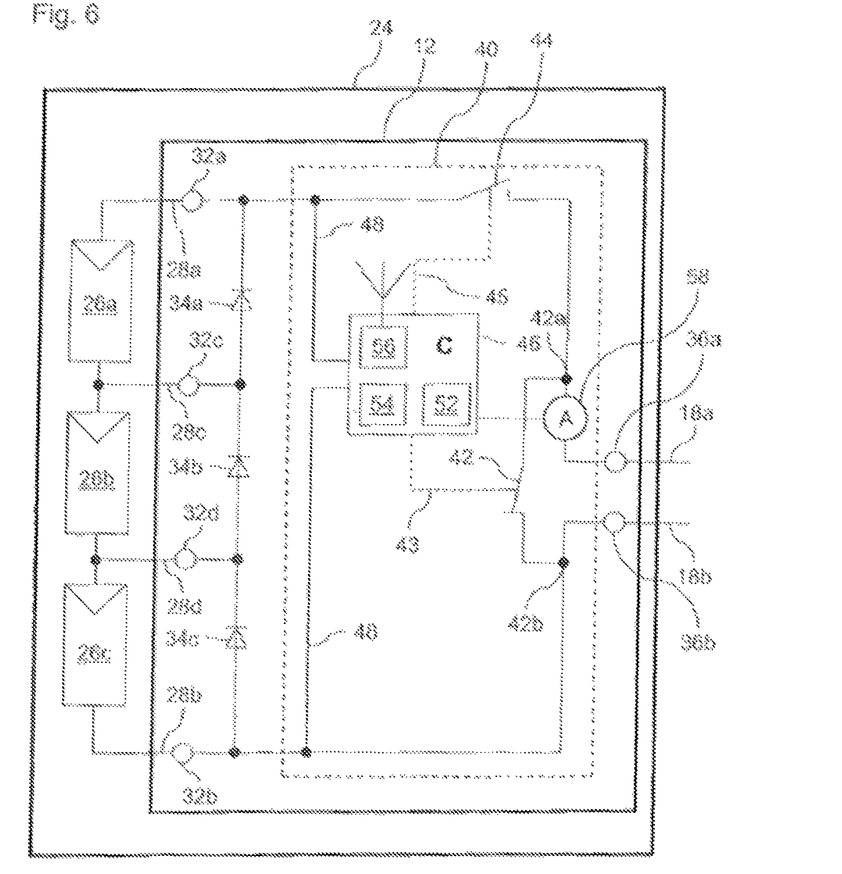
FIG. 6 shows the embodiment from FIG. 5 in the protected state.

FIG. 6 shows the embodiment from FIG. 5 in the protected state. According to the preferred exemplary embodiment, the short-circuiting switch 42 is embodied as a break contact or normally-closed contact and the isolating switch 44 is embodied as a make contact or normally-open contact. If the power supply of the control unit 46 from the associated solar panel 24 is interrupted, e.g. due to a contact problem at one of the input-side connecting elements 32a, 32b or if the control unit 46 is defective, then the protective circuit 40 automatically falls into the protected state, i.e., the short-circuiting switch falls into the closed position and the isolating switch falls into the open position. The protective circuit then remains in the protected state until an active intervention by the control unit 26 takes place, which activates the protective circuit 40 back into the operating state, i.e., the short-circuiting switch 42 opens and the isolating switch 44 closes. For example, this can be implemented with corresponding relays or normally-off and normally-on MOSFETs.

Figure 7:
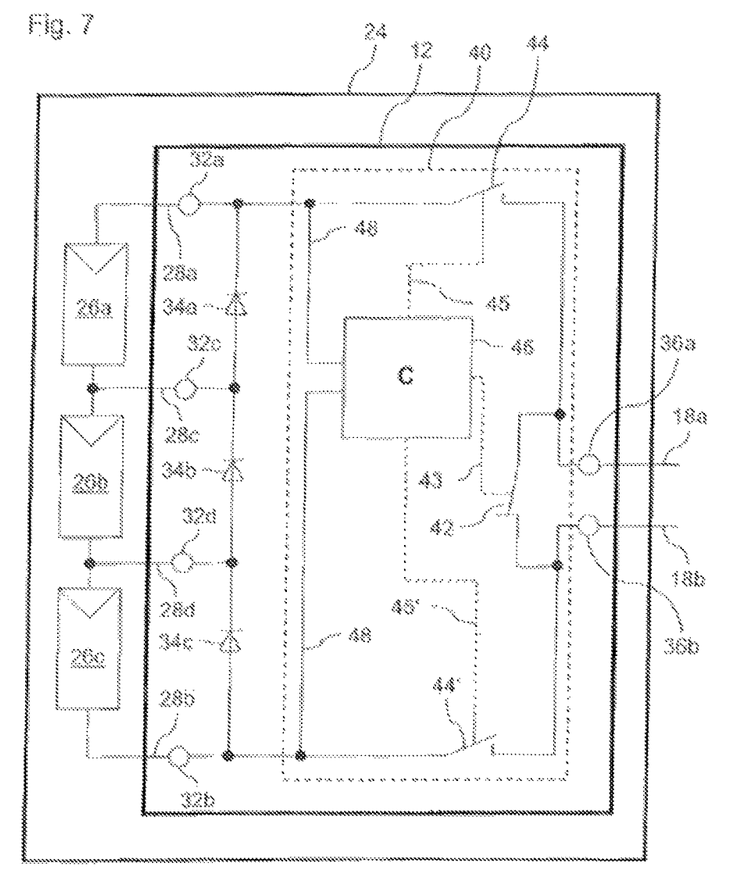
FIG. 7 shows another embodiment of the present disclosure in the protected state.

FIG. 7 shows another modification of the present disclosure in which the protective circuit also has a second isolating switch 44, which is connected in series between the negative pole of the solar cells 26 and the short-circuiting switch 42. As a result, the two connections 42a and 42b of the short-circuiting switch can optionally be galvanically separated from the solar cells 26. By contrast, the protective circuit according to FIGS. 3 through 6 merely consists of the short-circuiting switch 42, the isolating switch 44, and the control unit 46 for controlling the two switches 42, 44.

For maintenance work, each solar panel 24 with the protective circuit 40 according to the present disclosure can be individually disconnected from the string 18a, 18b without influencing the functionality of the respective other solar panels in the string 18a, 18b (aside from the fact that the string voltage decreases) and nevertheless, the electronics 46, 52, 54, 56 that are provided in the junction box 12 of the disconnected solar panel 24 can continue being supplied with electrical power by the solar cells 26a, 26b, 26c of this solar panel 24. In particular, the control unit 46 continues to be supplied with electrical power from the solar cells 26a, 26b, 26c even in the protected state and is therefore able to trigger the switching actions of the switches 42 and 44 from the protected state into the operating state.

It is clear to the person skilled in the art that the embodiments described above are to be understood as examples and that the invention is not limited to them, but can instead be varied in multiple ways without going beyond the scope of the invention. Furthermore, regardless of whether the features are disclosed in the description, the claims, the drawings, or in some other way, they also define components of the invention individually, even if they have been described together with other features, for example in the exemplary embodiments.

The invention claimed is:

1. A junction box for a solar panel is provided for electrically connecting external connecting lines to a solar panel, wherein the junction box includes:
    a junction box housing,
    input-side connecting elements for connecting voltage-carrying conductors of the positive pole and negative pole of the solar panel,
    output-side connecting elements for connecting a first and second external connecting lines to the junction box, and
    a protective circuit that defines an operating state and a protected state, wherein in the operating state, the first external connecting line is electrically connected to the voltage-carrying conductor of the positive pole of the solar panel and the second external connecting line is electrically connected to the voltage-carrying conductor of the negative pole of the solar panel for feeding the electrical power produced by the solar panel into the power grid via the first and second external connecting lines;
    wherein the protective circuit comprises a short-circuiting switch between the output-side connecting elements of the first and second external connecting lines and an isolating switch; and
    wherein in the protected state, the short-circuiting switch short-circuits the output-side connecting elements of the first and second external connecting lines to each other and the isolating switch disconnects the short-circuiting switch from the solar panel on at least one side,
    further including a current sensor connected between one of the external connecting lines and the short-circuiting switch for measuring the current flowing in the external connecting lines in the protected state,
    wherein the protective circuit is adapted to switch from the protected state into the operating state in response to an initial current flowing through the external connecting lines in the protected state.

2. The junction box for a solar panel according to claim 1, wherein the short-circuiting switch is installed in the junction box, directly upstream of the output-side connecting elements of the first and second external connecting lines from the perspective of the poles of the solar panel, and the isolating switch is connected in series in the junction box, between the input-side connecting element of the voltage-carrying conductor of the positive pole of the solar panel or the input-side connecting element of the voltage-carrying conductor of the negative pole of the solar panel and the associated connection of the short-circuiting switch.

3. The junction box for a solar panel according to claim 1 or 2, wherein the junction box includes at least one bypass circuit for shadowing effect compensation and the isolating switch is connected in series with the at least one bypass circuit for shadowing effect compensation and/or the short-circuiting switch is connected in parallel with the at least one bypass circuit for shadowing effect compensation.

4. The junction box for a solar panel according to claim 3, wherein the at least one bypass circuit for shadowing effect compensation is connected—from the perspective of the poles of the solar panel—upstream of the isolating switch and short-circuiting switch so that the at least one bypass circuit for shadowing effect compensation remains connected to the solar panel even in the protected state.

5. The junction box for a solar panel according to claim 1, for a solar panel that is divided into several separately contactable groups of solar cells, with electrical intermediate takeoffs between the groups, including additional input-side connecting elements for connecting voltage-carrying conductors of the intermediate takeoffs and a plurality of bypass circuits for shadowing effect compensation, which are respectively connected in parallel with the associated groups of solar cells when the junction box is mounted onto the solar panel,
    wherein the short-circuiting switch is connected in parallel to the bypass circuits for shadowing effect compensation and to the groups of solar cells when the junction box is mounted onto the solar panel, and
    wherein the isolating switch is connected in series with the short-circuiting switch and the bypass circuits for shadowing effect compensation and to the groups of solar cells when the junction box is mounted onto the solar panel, in order, in the protected state, to disconnect the short-circuiting switch by means of the isolating switch from all of the groups of solar cells and bypass circuits for shadowing effect compensation.

6. The junction box for a solar panel according to claim 1, wherein the short-circuiting switch and the isolating switch are built into the junction box housing upstream—from the perspective of the poles of the solar panel—of any detachable connectors situated outside the junction box.

7. The junction box for a solar panel according to claim 1, including a control unit that controls the switching of the protective circuit from the protected state into the operating state, wherein the control unit is supplied with electrical energy by the associated solar panel in the protected state.

8. The junction box for a solar panel according to claim 1, wherein the short-circuiting switch and/or the isolating switch include(s) a mechanical switch, an electromechanical switch, or a semiconductor switch.

9. The junction box for a solar panel according to claim 1, wherein the short-circuiting switch is embodied as a break contact, which is closed in the inactive state.

10. The junction box for a solar panel according to claim 9, wherein the isolating switch is embodied as a make contact and is open in the inactive state.

11. The junction box for a solar panel according to 10, wherein in the protected state, the short-circuiting switch and isolating switch are in the inactive state and are activated from the respective inactive state by means of the control unit in order, in response to the activation, to switch the protective circuit from the inactive protected state into the operating state.

12. The junction box for a solar panel according to claim 11, wherein the control unit includes a safety device that requires an authorization for the activation of the protective circuit from the protected state into the operating state.

13. The junction box for a solar panel according to claim 1, wherein at least one antitheft device, a maximum power point tracking control unit, a voltage monitoring unit, a current monitoring unit, and/or a temperature monitoring unit are built into the junction box, which are connected—from the perspective of the poles of the solar panel—upstream of the isolating switch and short-circuiting switch and the antitheft device, the maximum power point tracking control unit, the voltage monitoring unit, the current monitoring unit, and/or the temperature monitoring unit are supplied with electrical power from the solar panel even in the protected state.

14. A method for disconnecting at least one solar panel, each equipped with a junction box according to claim 1, in an installed, light-exposed, and voltage-producing solar generator in order to perform maintenance or in the event of a hazardous incident, particularly in the event of fire, and for switching again into the operating state afterwards,
wherein the at least one solar panel is/are individually disconnected from the remaining solar panels of the solar generator in that in the associated protective circuit, the short-circuiting switch is first closed in a first step in order to short-circuit the output-side connecting elements of the first and second external connecting lines to each other and then in a subsequent, second step, the isolating switch is opened and disconnects the already closed short-circuiting switch from at least one pole of the solar panel, for switching the protective circuit from the operating state into the protected state and,
wherein the current flowing through the external connecting lines is measured with each current sensor connected to an external connecting line and the short-circuiting switch associated to each of the at least one solar panel, respectively, and the protective circuits are switched from the protected state into the operating state in response to the measured current.

15. A protective circuit for a solar panel, including
a control unit for controlling the protective circuit;
wherein the protective circuit defines an operating state in which the electrical power of the solar panel is conducted out via the first and second external connecting lines and a protected state in which the external connecting lines are switched to a powerless state with regard to the associated solar panel;
wherein the protected state is an inactive state into which the protective circuit automatically falls when without current and in which it remains until the protective circuit is activated again by the control unit; and
wherein the control unit is supplied with electrical power from the associated solar panel in the protected state so that it is able to activate the protective circuit from the protected state into the operating state,
further including a current sensor connected to the first external connecting line or the second external connecting line and a switch, wherein the current sensor is adapted to measure the current flowing in the external connecting lines in the protected state,
wherein the protective circuit is adapted to switch from the protected state into the operating state.

16. A method for delivering and installing a solar generator, wherein
a plurality of solar panels, each with a respective junction box with an associated protective circuit, is delivered to the installation site in a protected state by the manufacturer;
the solar panels are installed at the installation site and are wired to the external connecting lines, whereupon the solar generator is subjected to the standardized commissioning tests; and
the protective circuits of the solar panels are switched from the protected state into the operating state only after installation tests and the commissioning tests of the solar generator have been completed,
wherein the current flowing through the external connecting lines is measured with current sensors each associated with a solar panel where the current sensor is connected between an external connecting line and an isolating switch and the protective circuits are switched from the protected state into the operating state.

17. The method according to claim 16,
wherein the activation of the protective circuit from the protected state into the operating state by the control unit requires an authorization.

* * * * *